(12) United States Patent
Shao et al.

(10) Patent No.: US 9,159,448 B2
(45) Date of Patent: Oct. 13, 2015

(54) SHIFT REGISTER UNIT, SHIFT REGISTER AND SCANNING METHOD THEREOF, AND DISPLAY DEVICE

(71) Applicants: BOE Technology Group Co., Ltd., Beijing (CN); Hefei BOE Optoelectronics Technology Co., Ltd., Anhui (CN)

(72) Inventors: Xianjie Shao, Beijing (CN); Rui Ma, Beijing (CN); Guolei Wang, Beijing (CN); Ming Hu, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 129 days.

(21) Appl. No.: 14/101,768

(22) Filed: Dec. 10, 2013

(65) Prior Publication Data

US 2014/0168048 A1 Jun. 19, 2014

(30) Foreign Application Priority Data

Dec. 15, 2012 (CN) .......................... 2012 1 0545857

(51) Int. Cl.
*G09G 3/36* (2006.01)
*G11C 19/28* (2006.01)

(52) U.S. Cl.
CPC .............. *G11C 19/28* (2013.01); *G09G 3/3677* (2013.01); *G09G 2310/0283* (2013.01); *G09G 2310/0286* (2013.01)

(58) Field of Classification Search
CPC ................... G09G 2310/0283; G09G 3/3677; G11C 19/28
USPC ......................................... 345/100
See application file for complete search history.

(56) References Cited

U.S. PATENT DOCUMENTS

| 2003/0227433 A1* | 12/2003 | Moon ........................... 345/100 |
| 2008/0012818 A1* | 1/2008 | Lee et al. ....................... 345/100 |
| 2012/0105398 A1* | 5/2012 | Park et al. ...................... 345/206 |
| 2012/0250816 A1* | 10/2012 | Tsai et al. ........................ 377/77 |

* cited by examiner

*Primary Examiner* — Jonathan Blancha
(74) *Attorney, Agent, or Firm* — Westman, Champlin & Koehler, P.A.

(57) ABSTRACT

A shift register unit, a shift register and the scanning method thereof, and a display device are disclosed. Bidirectional scanning can be achieved while the number of the switches used in the shift register could be reduced, and the spaces are saved. Furthermore, the problem of large coupled noise voltage is solved, and the performance of the shift register is improved. The circuit comprises: a second switch connected with a first switch; a fourth switch connected with a third switch; a fifth switch connected with a sixth switch; a first input and a eighth switch connected with a seventh switch; a output end and a ninth switch connected with the eighth switch; an eleventh, a twelfth, and a thirteenth switch connected with a tenth switch; a fourteenth switch connected with the thirteenth switch; a fifteenth switch connected with the fourteenth switch; a capacitor positioned between a first node and a second nodes.

13 Claims, 8 Drawing Sheets

S201 — At the first stage, the second reverse DC signal $VDCR_2$, which is at high level, turns on the fourth switch $M_4$, the signal inputted through the second input $G_2$ turns on the second switch $M_2$, the ninth switch $M_9$ is turned on. The high level signal Von charges the capacitor C at the first node A via the fourth $M_4$ and the second switches $M_2$. The first $M_1$, the third $M_3$, the sixth $M_6$, the eighth $M_8$, the twelfth $M_{12}$, the thirteenth $M_{13}$, the fourteenth $M_{14}$, and the fifteenth switches $M_{15}$ are turned off; the fifth $M_5$, the seventh $M_7$, the tenth $M_{10}$, and the eleventh switches $M_{11}$ are turned on. The output end outputs low level.

S202 — At the second stage, the signal inputted through the second input $G_2$ turns off the second switch $M_2$, the second reverse DC signal $VDCR_2$ turns on the fourth switch M4, and the high level voltage at the first node A of the capacitor C maintains the ninth switch M9 at turn-on state. The first $M_1$, the third $M_3$, the sixth $M_6$, the eighth $M_8$, the tenth $M_{10}$, the twelfth $M_{12}$, the thirteenth $M_{13}$, the fourteenth $M_{14}$, and the fifteenth switches $M_{15}$ are turned off; the fifth $M_5$, the seventh $M_7$, and the eleventh switches $M_{11}$ are turned on. The first clock signal CLK, which is at high level, is outputted from the output end via the ninth switch $M_9$.

S203 — At the third stage, the second reverse DC signal $VDCR_2$ turns on the fourth $M_4$ and the seventh switches $M_7$; the high level signal inputted through the first input $G_1$ turns on the first $M_1$ and the eighth switches $M_8$. The second $M_2$, the third $M_3$, the sixth $M_6$, the twelfth $M_{12}$, the thirteenth $M_{13}$, the fourteenth $M_{14}$, the fifteenth $M_{15}$, and the ninth switch $M_9$ are turned off; the fifth $M_5$, the tenth $M_{10}$, and the eleventh switch $M_{11}$ are turned on. The capacitor C is discharged via the first switch $M_1$ and the eighth switch $M_8$. The output end outputs low level.

S204 — At the fourth stage, the second clock signal CLKB, which is at low level, turns off the tenth switch $M_{10}$; the control signal CN turns off the eleventh switch $M_{11}$. The first $M_1$, the second $M_2$, the third $M_3$, the sixth $M_6$, the eighth $M_8$, the ninth $M_9$, the twelfth $M_{12}$, the thirteenth $M_{13}$, the fourteenth $M_{14}$, and the fifteenth switches $M_{15}$ are turned off; the fourth $M_4$, the fifth $M_5$, and the seventh switches $M_{11}$ are turned on. The output end Output outputs low level.

S205 — At the fifth stage, the second clock signal CLKB, which is at high level, turns on the tenth switch $M_{10}$; the control signal CN turns off the eleventh switch $M_{11}$. The first $M_1$, the second $M_2$, the third $M_3$, the sixth $M_6$, the eighth $M_8$, the ninth $M_9$, the fourteenth $M_{14}$ and the fifteenth switches $M_{15}$ are turned off; the fourth $M_4$, the fifth $M_5$, the seventh $M_7$, the twelfth $M_{12}$, the thirteenth switch $M_{13}$ are turned on. The noises at the first node A and the second node B of the capacitor C are released via the twelfth switch $M_{12}$ and the thirteenth switch $M_{13}$ which are turned on, so as to ensure that the output end Output of the shift register is stably maintained at low level.

SHIFT REGISTER UNIT, SHIFT REGISTER AND SCANNING METHOD THEREOF, AND DISPLAY DEVICE

CROSS-REFERENCE TO RELATED APPLICATION

This application claims the benefit of Chinese Patent Application No. 201210545857.2 filed on Dec. 15, 2012 in the State Intellectual Property Office of China, the whole disclosure of which is incorporated herein by reference.

BACKGROUND OF THE INVENTION

1. Field of the Invention

Embodiments of the invention relates to the field of display technique, and especially to a shift register unit, a shift register comprising the shift register unit and the scanning method thereof, and a display device.

2. Description of the Related Art

In digital circuits for a liquid crystal display (LCD) device, thin-film transistor drivers mainly comprise gate line drivers and date line drivers. The gate line drivers are configured to convert the inputted clock signal via shift registers, and apply the converted signal to the gate line of a LCD device. The shift registers are positioned in the gate line drivers of the LCD device, each gate line is connected to one sub-circuit of the shift register, and drive signal is provided to the gate line via the gate line driver.

In prior art, traditional shift register scans in one direction. To scan in both directions, two those shift registers for scanning in one direction should be connected together based on mirror principle. However, the structure of the shift register that can scan in both directions is usually very complicated because so many thin-film transistors, for example, 20 to 30 thin-film transistors, are used in the shift register. To properly arrange those thin-film transistors is time-consuming and cost-wasting. Besides, large coupled noise voltage is generated between the thin-film transistors, such that the performance of the shift register is affected.

SUMMARY OF THE INVENTION

The present invention has been made to overcome or alleviate at least one aspect of the above mentioned disadvantages.

In the embodiments of the invention, a shift register unit, a shift register and the scanning method thereof, and a display device are provided, such that, bidirectional scanning can be achieved while the number of the switches used in the shift register could be reduced, and the spaces are saved. Furthermore, the problem of large coupled noise voltage is solved, and the performance of the shift register is improved.

According to an aspect embodiment of the present invention, there is provided a shift register is provided, comprising:

a first switch, of which the gate electrode receives a signal inputted through a first input;

a second switch, of which the source electrode is connected with the drain electrode of the first switch, and the gate electrode receives a signal inputted through a second input;

a third switch, of which the drain electrode is connected with the source electrode of the first switch, the source electrode receives a high level signal, and the gate electrode receives a first forward DC signal;

a fourth switch, of which the source electrode is connected with the source electrode of the third switch, and the gate electrode receives a second reverse DC signal;

a fifth switch, of which the drain electrode is connected with the drain electrode of the third switch, the gate electrode receives a first reverse DC signal, and the source electrode receives a low level signal;

a sixth switch, of which the source electrode is connected with the source electrode of the fifth switch, the drain electrode is connected both with drains of the second switch and the fourth switch, and the gate electrode receives a second forward DC signal;

a seventh switch, of which the drain electrode receives the signal inputted through the first input, and the gate electrode receives the second reverse DC signal;

an eighth switch, of which the gate electrode is connected with the source electrode of the seventh switch, the source electrode is connected with the source electrode of the first switch, and the drain electrode is connected with an output end;

a ninth switch, of which the drain electrode is connected with the drain electrode of the eighth switch, the gate electrode is connected with the drain electrode of the first switch, and the source electrode receives a first clock signal;

a tenth switch, of which the source electrode and the gate electrode both receive a second clock signal;

an eleventh switch, of which the source electrode is connected with the drain electrode of the tenth switch, the gate electrode receives a control signal, and the drain electrode receives the low level signal;

a twelfth switch, of which the gate electrode is connected with the drain electrode of the tenth switch, the drain electrode is connected with the source electrode of the second switch, and the source electrode receives the low level signal;

a thirteenth switch, of which the gate electrode is connected with the drain electrode of the tenth switch, and the drain electrode receives the low level signal;

a fourteenth switch, of which the source electrode is connected with the source electrode of the thirteenth switch and the output end, and the drain electrode is connected with the drain electrode of the sixth switch;

a fifteenth switch, of which the source electrode is connected with the gate electrode of the fourteenth switch, the drain electrode receives the signal inputted through the second input, and the gate electrode receives the second forward DC signal; and a capacitor positioned between a first node and a second node, wherein the first node is connected to the drain of the first switch, and the second node is connected to the output end.

According to another aspect embodiment of the present invention, there is provided a shift register, comprising (N+1) shift register units as defined above embodiment, wherein the output end of the Nth shift register unit is connected to the second input of the (N−1)th shift register unit, the output end of the Nth shift register unit is connected to the first input of the (N+1)th shift register unit, and N is a positive integer.

According to another aspect embodiment of the present invention, there is provided a display device, comprising:

a display area provided with a plurality of pixels for displaying images;

a gate drive circuit configured to send scanning signals to the display area; and a data drive circuit configured to send data signals to the display area, wherein the gate drive circuit comprises the shift register as defined above embodiment.

According to a further aspect embodiment of the present invention, there is provided a scanning method for the shift register defined above embodiments, wherein the first forward DC signal and the second forward DC signal are high level signals, the first reverse DC signal and the second reverse DC signal are at low level, and the method comprises the following steps:

at a first stage, the first forward DC signal turns on the third switch, the signal inputted through the first input turns on the first switch, the ninth switch is turned on, and the high level signal charges the capacitor via the third and the first switches; the second, the fourth, the fifth, the seventh, the eighth, the twelfth, the thirteenth, and fourteenth switches are turned off; the sixth, the tenth, the eleventh, and the fifteenth switches are turned on; the output end outputs low level;

at a second stage, the signal inputted through the first input turns off the first switch, the first forward DC signal turns on the third switch, and the voltage at the first node maintains the ninth switch at turn-on state; the second, the fourth, the fifth, the seventh, the eighth, the tenth, the twelfth, the thirteenth, and the fourteenth switches are turned off; the sixth, the eleventh, and the fifteenth switches are turned on; the first clock signal, which is at high level, is outputted from the output end via the ninth switch;

at a third stage, the second forward DC signal turns on the sixth and the fifteenth switches; the high level signal inputted through the second input turns on the second and the fourteenth switch; the first, the fourth, the fifth, the seventh, the eighth, the twelfth, the thirteenth, and the ninth switches are turned off; the third, the tenth, and the eleventh switches are turned on; the capacitor id discharged via the second and the fourteenth switches which are turned on; the output end outputs low level;

at a fourth stage, the second clock signal, which is at low level, turns off the tenth switch; the control signal turns off the eleventh switch; the first, the second, the fourth, the fifth, the seventh, the eighth, the ninth, the twelfth, the thirteenth, and the fourteenth switches are turned off; the third, the sixth, and the fifteenth switches are turned on; the second node of the capacitor is still maintained at low level, and the output end outputs low level; and at a fifth stage, the second clock signal, which is at high level, turns on the tenth switch; the control signal turns off the eleventh switch; the first, the second, the fourth, the fifth, the seventh, the eighth, the ninth, the fourteenth switches are turned off, the third, the sixth, the twelfth, the thirteenth, and the fifteenth switches are turned on; the noise at the first node and the second node of the capacitor is released via the twelfth and the thirteenth switch which are turned on, so as to ensure that the output end of the shift register is maintained stably at low level.

According to a still further aspect embodiment of the present invention, there is provided a scanning method for the shift register defined above embodiment, wherein the first forward DC signal and the second forward DC signal are low level signals, the first reverse DC signal and the second reverse DC signal are high level signals, and the method comprises the following steps:

at a first stage, the second reverse DC signal turns on the fourth switch, the signal inputted through the second input turns on the second switch, and the ninth switch is turned on; the high level signal charges the capacitor at the first node via the fourth and the second switch; the first, the third, the sixth, the eighth, the twelfth, the thirteenth, the fourteenth, and the fifteenth switches are turned off; the fifth, the seventh, the tenth, and the eleventh switches are turned on; the first clock signal, which is at low signal, maintains the ninth switch at turn-off state; the output end outputs low level;

at a second stage, the signal inputted through the second input turns off the second switch, the second reverse DC signal turns on the fourth switch, and the voltage at the first node maintains the ninth switch at turn-on state; the first, the third, the sixth, the eighth, the tenth, the twelfth, the thirteenth, the fourteenth, and the fifteenth switches are turned off; the fifth, the seventh, and the eleventh switches are turned on; the first clock signal, which is at high level, is outputted from the output end via the ninth switch;

at a third stage, the second reverse DC signal turns on the fourth and the seventh switch; the high level signal inputted through the first input turns on the first and the eighth switches; the second, the third, the sixth, the twelfth, the thirteenth, the fourteenth, the fifteenth, and the ninth switches are turned off; the fifth, the tenth, and the eleventh switches are turned on; the capacitor is discharged via the first and the eighth switches; the output end outputs low level;

at a fourth stage, the second clock signal, which is at low level, turns off the tenth switch; the control signal turns off the eleventh switch; the first, the second, the third, the sixth, the eighth, the ninth, the twelfth, the thirteenth, the fourteenth, and the fifteenth switches are turned off; the fourth, the fifth, and the seventh switches are turned on; and the output end outputs low level;

at a fifth stage, the second clock signal, which is at high level, turns on the tenth switch; the control signal turns off the eleventh switch; the first, the second, the third, the sixth, the eighth, the ninth, the fourteenth and the fifteenth switches are turned off; the fourth, the fifth, the seventh, the twelfth, the thirteenth switches are turned on; the noises at the first and the second nodes of the capacitor are released via the twelfth and the thirteenth switches which are turned on, so as to ensure that the output end of the shift register is stably maintained at low level.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Figure 1:
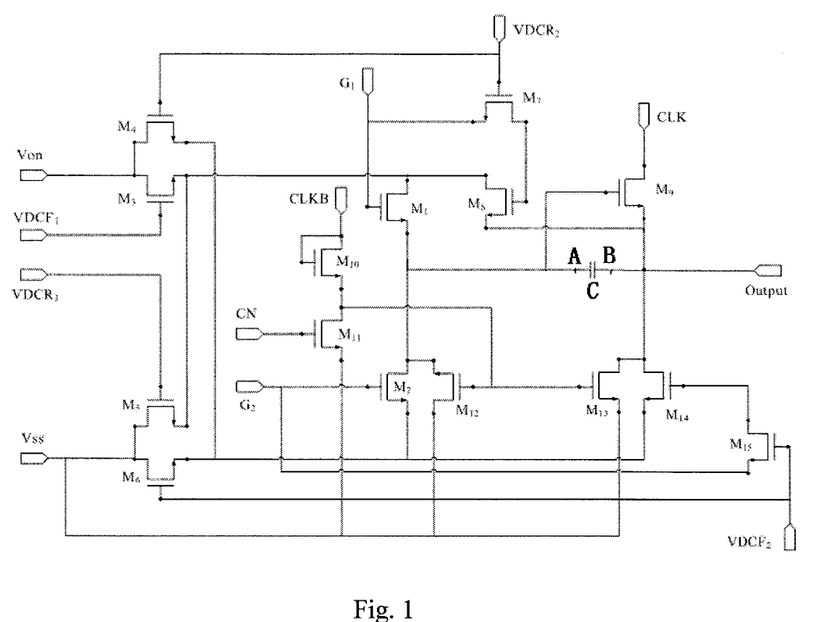
FIG. 1 is a circuit principle diagram illustrating a shift register unit according to one exemplary embodiment of the present invention.

FIG. 1 is a circuit principle diagram illustrating a shift register unit according to one exemplary embodiment of the present invention. The shift register unit comprising:

a first switch $M_1$, of which the gate electrode receives a signal inputted through a first input $G_1$;

a second switch $M_2$, of which the source electrode is connected with the drain electrode of the first switch $M_1$, and the gate electrode receives a signal inputted through a second input $G_2$;

a third switch $M_3$, of which the drain electrode is connected with the source electrode of the first switch $M_1$, the source electrode receives a high level signal Von, and the gate electrode receives a first forward DC signal $VDCF_1$;

a fourth switch $M_4$, of which the source electrode is connected with the source electrode of the third switch $M_3$, and the gate electrode receives a second reverse DC signal $VDCR_2$;

a fifth switch $M_5$, of which the drain electrode is connected with the drain electrode of the third switch $M_3$, the gate electrode receives a first reverse DC signal $VDCR_1$, and the source electrode receives a low level signal Vss;

a sixth switch $M_6$, of which the source electrode is connected with the source electrode of the fifth switch $M_5$, the drain electrode is connected with both drains of the second switch $M_2$ and the fourth switch $M_4$, and the gate electrode receives a second forward DC signal $VDCF_2$;

a seventh switch $M_7$, of which the drain electrode receives the signal inputted through the first input $G_1$, and the gate electrode receives the second reverse DC signal $VDCR_2$;

an eighth switch $M_8$, of which the gate electrode is connected with the source electrode of the seventh switch $M_7$, the source electrode is connected with the source electrode of the first switch $M_1$, and the drain electrode is connected with an output end Output;

a ninth switch $M_9$, of which the drain electrode is connected with the drain electrode of the eighth switch $M_8$ and the output end Output, the gate electrode is connected with the drain electrode of the first switch $M_1$, and the source electrode receives a first clock signal CLK;

a tenth switch $M_{10}$, of which the source electrode and the gate electrode both receive a second clock signal CLKB;

an eleventh switch $M_{11}$, of which the source electrode is connected with the drain electrode of the tenth switch $M_{10}$, the gate electrode receives a control signal CN, and the drain electrode receives the low level signal Vss;

a twelfth switch $M_{12}$, of which the gate electrode is connected with the drain electrode of the tenth switch $M_{10}$, the drain electrode is connected with the source electrode of the second switch $M_2$, and the source electrode receives the low level signal Vss;

a thirteenth switch $M_{13}$, of which the gate electrode is connected with the drain electrode of the tenth switch $M_{10}$, and the drain electrode receives the low level signal Vss;

a fourteenth switch $M_{14}$, of which the source electrode is connected with the source electrode of the thirteenth switch $M_{13}$ and the output end Output, and the drain electrode is connected with the drain electrode of the sixth switch $M_6$;

a fifteenth switch $M_{15}$, of which the source electrode is connected with the gate electrode of the fourteenth switch $M_{14}$, the drain electrode receives the signal inputted through the second input $G_2$, and the gate electrode receives the second forward DC signal $VDCF_2$;

a capacitor C positioned between a first node A and a second node B, wherein the first node A is connected to the drain of the first switch $M_1$, and the second node B is connected to the output end Output.

Furthermore, each of the switches $M_1$ to $M_{15}$ is a N-type thin-film transistor.

It is to be noted that, each thin-film transistor used in the embodiments of the invention is the N-type thin-film transistor, which is suitable for the case where the source is grounded. The transistor is switched into turn-on state when a voltage between the source and the gate is higher than a threshold voltage of the transistor, and is switched into turn-off state when the voltage between the source and the gate is lower than or equal to the threshold voltage.

In the above shift register unit, if one of the first clock signal CLK and the second clock signal CLKB is at high level, then the other one is at low level. In one embodiment, the first clock signal CLK is at high level, and the second clock signal CLKB is at low level. At this time, the ninth switch $M_9$ is turned on, the tenth switch $M_{10}$ is turned off. In another embodiment, the first clock signal CLK is at low level, and the second clock signal CLKB is at high level, and at this time, the ninth switch $M_9$ is turned off, the tenth switch $M_{10}$ is turned on.

It should be noted that, in one exemplary embodiment, if the shift register is scanning forward, the first forward DC signal $VDCF_1$ and the second forward DC signal $VDCF_2$ are high level signals, the first reverse DC signal $VDCR_1$ and the second reverse DC signal $VDCR_2$ are low level signals. At this time, the third switch $M_3$ is turned on by the first forward DC signal $VDCF_1$, the sixth switch $M_6$ and the fifteenth switch $M_{15}$ are turned on by the second forward DC signal $VDCF_2$; the fifth switch $M_5$ is turned off by the first reverse DC signal $VDCR_1$, and the seventh switch $M_7$ and the fourth switch $M_4$ are turned off by the second reverse DC signal $VDCR_2$. In another exemplary embodiment, if the shift register is scanning reversely, the first forward DC signal $VDCF_1$ and the second forward DC signal $VDCF_2$ are low level signals, the first reverse DC signal $VDCR_1$ and the second reverse DC signal $VDCR_2$ are high level signals. At this time, the third switch $M_3$ is turned off by the first forward DC signal $VDCF_1$, the sixth switch $M_6$ and the fifteenth switch $M_{15}$ are turned off by the second forward DC signal $VDCF_2$; the fifth switch $M_5$ is turned on by the first reverse DC signal $VDCR_1$, and the seventh switch $M_7$ and the fourth switch $M_4$ are turned on by the second reverse DC signal $VDCR_2$.

In the shift register unit according to the embodiment of the invention, the turn-off/turn-on state of the each switch is controlled by the voltage across the gate and the source of the switch, so as to turn off or turn on the switch in different operation stages. Such that, bidirectional scanning of the shift register can be achieved while the number of the switches used in the shift register could be reduced, and the spaces are saved. Furthermore, the problem of large coupled noise voltage is solved, and the performance of the shift register is improved.

Figure 2:
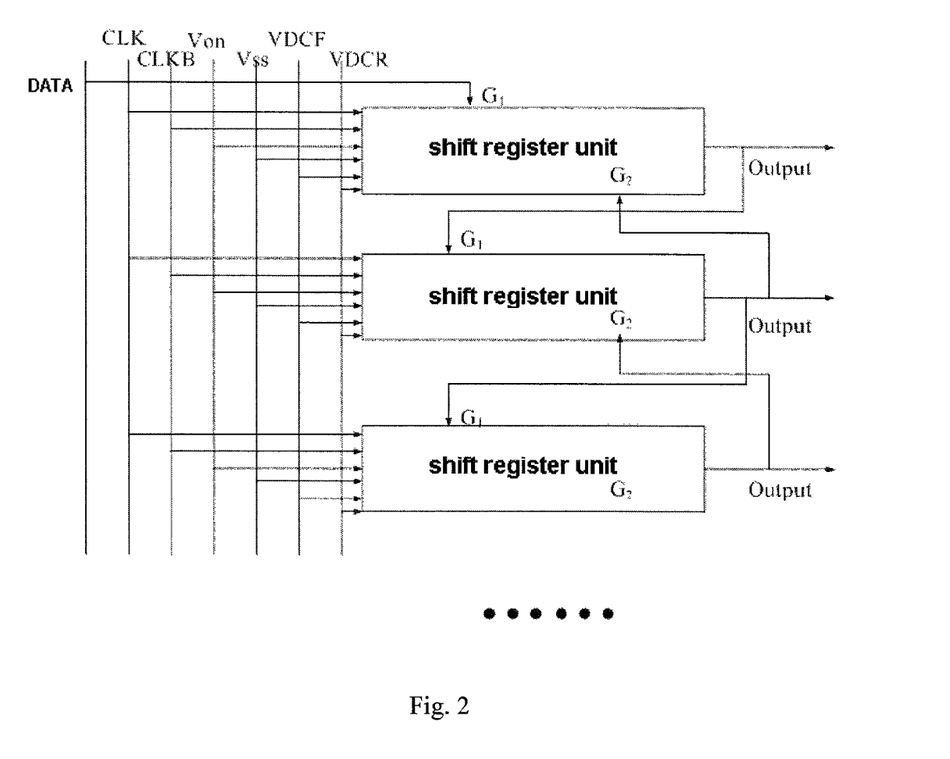
FIG. 2 is a principle diagram illustrating a shift register comprising the shift register unit of FIG. 1.

According to a further aspect of the embodiment of the present invention, a shift register is provided which comprises (N+1) shift register units as described in the above embodiments. As shown in FIG. 2, the output end Output of the Nth shift register unit is connected to the second input of the (N−1)th shift register unit, the output end Output of the Nth shift register unit is connected to the first input of the (N+1)th shift register unit, wherein N is a positive integer. Furthermore, the first input $G_1$ of the Nth shift register unit is connected to the output end Output of the (N−1)th shift register unit, and the second input $G_2$ of the Nth shift register unit is connected to the output end Output of the (N+1)th shift register unit.

Figure 3:
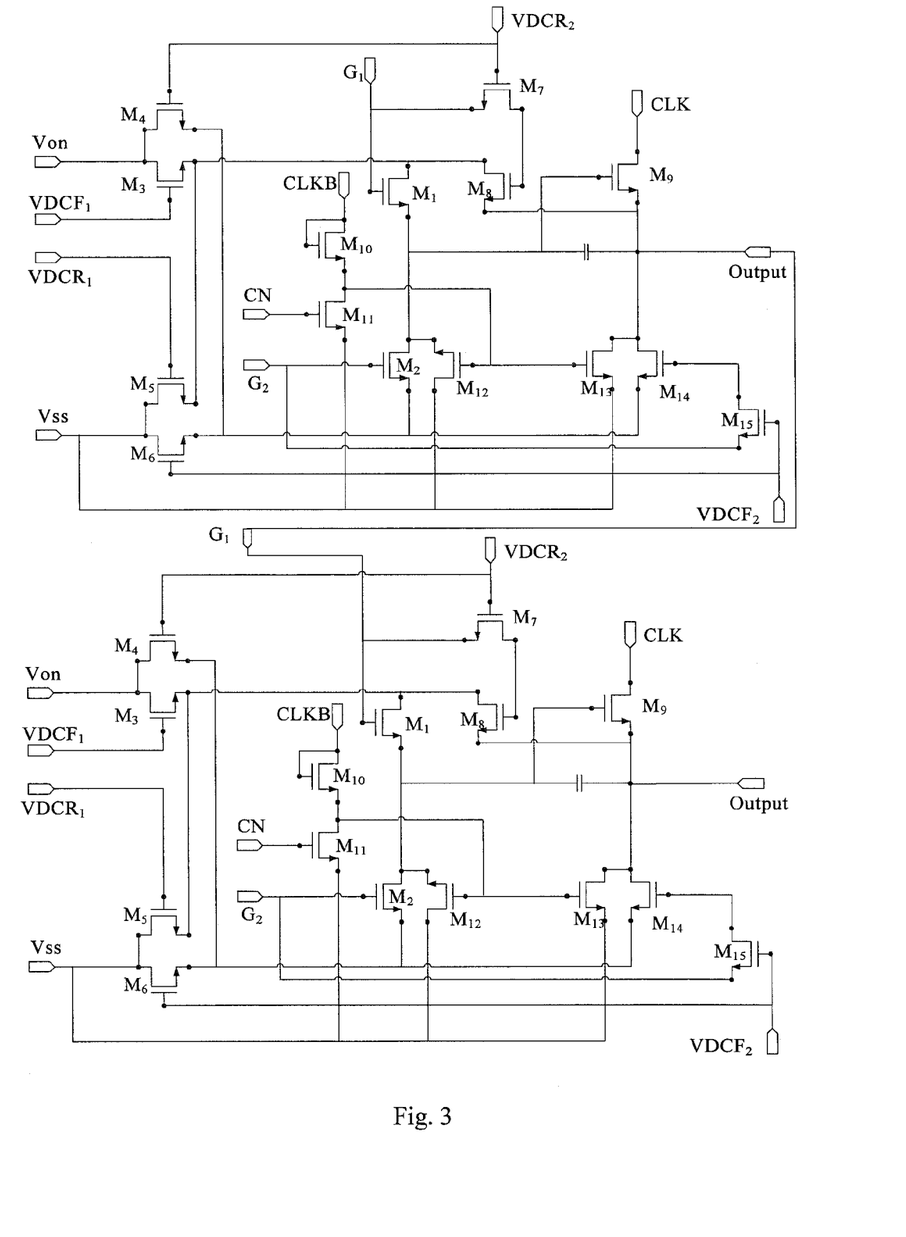
FIG. 3 is a circuit principle diagram illustrating two adjacent shift register units of the shift register of FIG. 2.

The shift register of the embodiment comprises a plurality of shift register units, and the plurality of shift register units are connected with each other via the first input $G_1$, the second input $G_2$, and output end Output of the shift register units. In one exemplary embodiment, as shown in FIGS. 2 and 3, when the (N−1)th shift register unit is connected with the Nth shift register unit, the second input $G_2$ of the (N−1)th shift register unit is connected to the output end Output of the Nth shift register unit, the first input $G_1$ of the Nth shift register unit is connected to the output end Output of the (N−1)th shift register unit. Therefore, while outputted from the output end Output of the (N−1)th shift register unit, the signal is also inputted into the first input $G_1$ of the Nth shift register unit, wherein N is a positive integer.

It should be noted that, when N=1, the Nth shift register unit is the first shift register unit, its first input $G_1$ is not connected to the output end Output of any other shift register units, and its second input $G_2$ is connected to the output end Output of the second shift register unit. When the Nth shift register unit is the last one, its first input $G_1$ is connected to the output end Output of the previous shift register unit, and its second input $G_2$ is not connected to the output end Output of any other shift register units. It is to be understood that, when N is a integer which is larger than 1, the first input $G_1$ of the first shift register unit is not connected to the output end Output of any other shift register units, the second input $G_2$ of the last shift register unit is not connected to the output end Output of any other shift register units.

According to one embodiment of the present invention, the shift register comprises N+1 stages of the shift register unit as described in the above embodiments, wherein, the output end of the Nth shift register unit is connected to the second input of the (N−1)th shift register unit, the output end of the Nth shift register unit is connected to the first input of the (N+1)th shift register unit, and N is a positive integer. By using this solution, the turn-off/turn-on state of each switch in the shift register unit is controlled in accord with the voltage between the gate and the source thereof, so as to turn off or turn on the switch in different stages. Such that, bidirectional scanning of the shift register can be achieved while the number of the switches used in the shift register could be reduced, and the spaces are saved. Furthermore, the problem of large coupled noise voltage is solved, and the performance of the shift register is improved.

Figure 4:
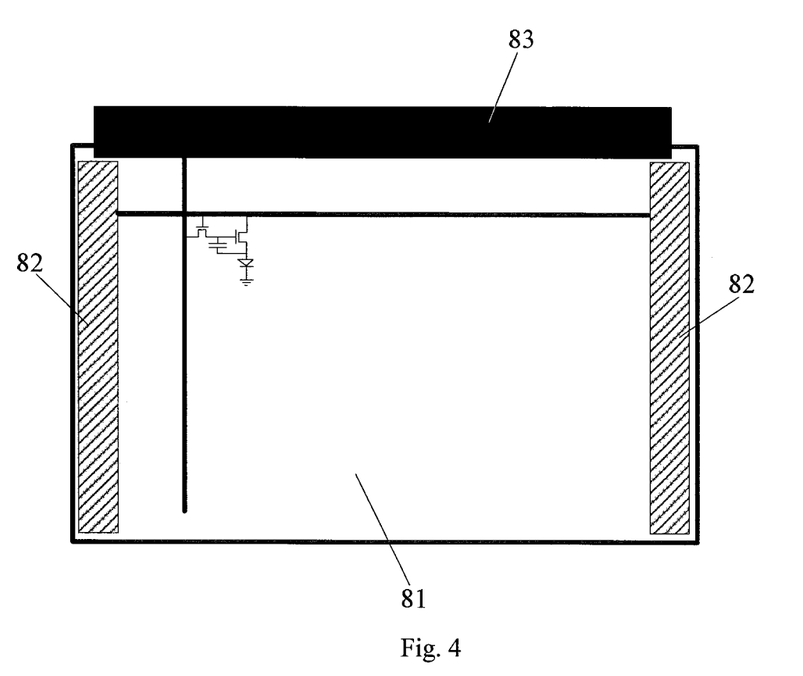
FIG. 4 is a schematic view illustrating the display device according to one exemplary embodiment of the present invention.

According to a further exemplary embodiment of the present invention, as shown in FIG. 4, a display device is provided, comprising: display area 81 having a plurality of pixels for displaying images; a gate drive circuit 82 configured to send scanning signals to the display area 81; and a data drive circuit 83 configured to send data signals to the display area 81, wherein, the gate drive circuit 82 may be the shift register in the above embodiments. The display device comprises the shift register with the above features. More specifically, the shift register comprises (N+1) shift register units as described in the above embodiments. By using this solution, the off/on state of each switch in the shift register unit is controlled in accord with the voltage between the gate and the source thereof, so as to turn off or turn on the switch in different stages. Such that, bidirectional scanning of the shift register can be achieved while the number of the switches used in the shift register could be reduced, and the spaces are saved. Furthermore, the problem of large coupled noise voltage is solved, and the performance of the shift register is improved.

The display device in the embodiments of the present invention may comprises a liquid crystal display device, a electroluminescent display device, etc. and the liquid crystal display device may be a LCD, a liquid crystal television, a digital frame, a mobile phone, a tablet PC, and other products or components with the function of displaying.

According to a still further exemplary embodiment of the present invention, a scanning method for the shift registers in the above embodiments is provided, wherein the first forward DC signal and the second forward DC signal are at high level, the first reverse DC signal and the second reverse DC signal is at low level, and the method comprises the following steps of:

at a first stage, the first forward DC signal turns on the third switch, the signal inputted through the first input turns on the first switch, the ninth switch is turned on, and the high level signal charges the capacitor C at the first node A via the third and the first switches; the first clock signal, which is at low level, maintains the node B of the capacitor C at low level via the ninth switch; the second, the fourth, the fifth, the seventh, the eighth, the twelfth, the thirteenth, and fourteenth switches are turned off; the sixth, the tenth, the eleventh, and the fifteenth switches are turned on; the output end outputs low level;

at a second stage, the signal inputted through the first input turns off the first switch, the first forward DC signal turns on the third switch, and the voltage at the first node maintains the ninth switch at turn-on state; the second, the fourth, the fifth, the seventh, the eighth, the tenth, the twelfth, the thirteenth, and the fourteenth switches are turned off; the sixth, the eleventh, and the fifteenth switches are turned on; the first clock signal, which is at high level, is outputted from the output end via the ninth switch;

at a third stage, the second forward DC signal turns on the sixth and the fifteenth switches; the high level signal inputted through the second input turns on the second and the fourteenth switches; the first, the fourth, the fifth, the seventh, the eighth, the twelfth, the thirteenth, and the ninth switches are turned off; the third, the tenth, and the eleventh switches are turned on; the capacitor C is discharged via the second and the fourteenth switches which are turned on; the output end outputs low level;

at a fourth stage, the second clock signal, which is at low level, turns off the tenth switch; the control signal turns off the eleventh switch; the first, the second, the fourth, the fifth, the seventh, the eighth, the ninth, the twelfth, the thirteenth, and the fourteenth switches are turned off; the third, the sixth, and the fifteenth switches are turned on; the second node B of the capacitor C is still maintained at low level, and the output end outputs low level;

at a fifth stage, the second clock signal, which is at high level, turns on the tenth switch; the control signal turns off the eleventh switch; the first, the second, the fourth, the fifth, the seventh, the eighth, the ninth, the fourteenth switches are turned off, the third, the sixth, the twelfth, the thirteenth, and the fifteenth switches are turned on; more specifically, the noise at the first node A and the second node B of the capacitor C is released via the twelfth and the thirteenth switch which are turned on, so as to ensure that the output end of the shift register is maintained stably at low level.

Figure 5:
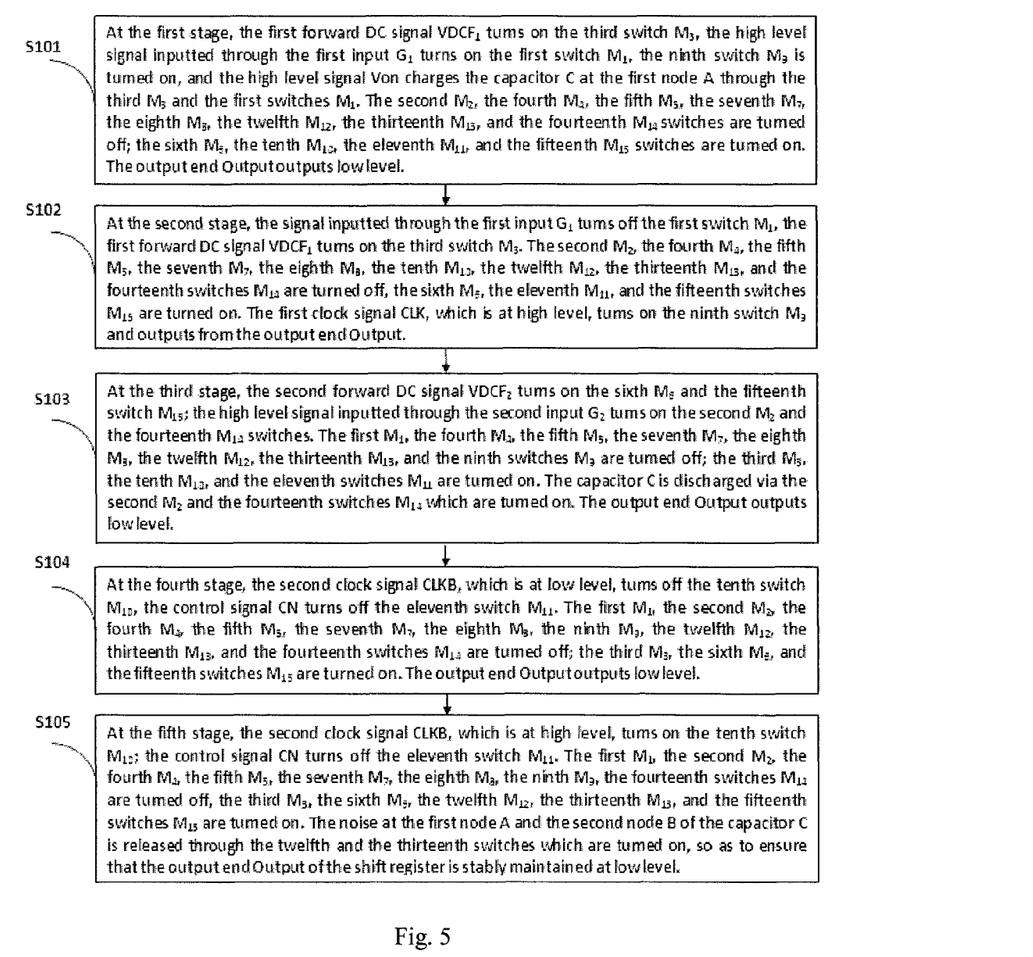
FIG. 5 is a flowchart of the first scanning method of one shift register unit in the shift register of FIG. 2.
Figure 6:
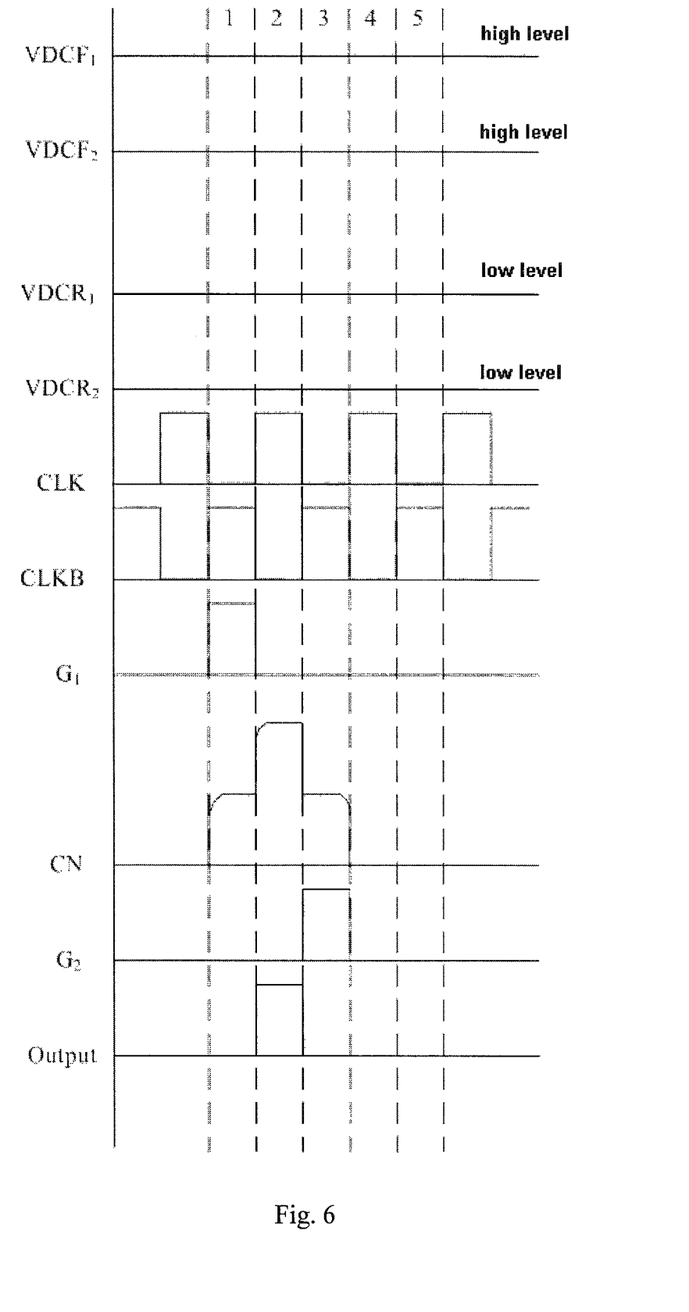
FIG. 6 is a sequence chart of the shift register unit in the shift register for performing the flowchart of FIG. 5.

Specifically, as shown in FIG. 5, the scanning method of the shift register unit of FIG. 1 in the shift register of FIG. 2 comprises the following steps in accord with the sequence chart shown in FIG. 6:

S101: At the first stage, the first forward DC signal $VDCF_1$ turns on the third switch $M_3$, the high level signal inputted through the first input $G_1$ turns on the first switch $M_1$, the ninth switch $M_9$ is turned on, and the high level signal Von charges the capacitor C at the first node A through the third $M_3$ and the first switches $M_1$. The second $M_2$, the fourth $M_4$, the fifth $M_5$, the seventh $M_7$, the eighth $M_8$, the twelfth $M_{12}$, the thirteenth $M_{13}$, and the fourteenth $M_{14}$ switches are turned off; the sixth $M_6$, the tenth $M_{10}$, the eleventh $M_{11}$, and the fifteenth $M_{15}$ switches are turned on. The output end Output outputs low level.

For example, see FIGS. 5 and 6, at the first stage 1, the first forward DC signal $VDCF_1$ and the second forward DC signal $VDCF_2$ are at high level, the first reverse DC signal $VDCR_1$ and the second reverse DC signal $VDCR_2$ are at low level, the first clock signal CLK is at low level, the second clock signal CLKB is at high level, the signal inputted through the first input $G_1$ is at high level, the signal inputted through the second input $G_2$ is at low level, the control signal CN is at high level.

Since the first forward DC signal $VDCF_1$ and the second forward DC signal $VDCF_2$ are at high level, the first forward DC signal $VDCF_1$ turns on the third switch $M_3$, and the second forward DC signal $VDCF_2$ turns on the sixth $M_6$ and the fifteenth $M_{15}$ switches. Since the first reverse DC signal $VDCR_1$ and the second reverse DC signal $VDCR_2$ are at low level, the first reverse DC signal $VDCR_1$ turns off the fifth switch $M_5$, the second reverse DC signal $VDCR_2$ turns off the seventh $M_7$ and the fourth $M_4$ switches. Since the signal inputted through the first input $G_1$ is at high level, the signal inputted through the first input $G_1$ turns on the first switch $M_1$, and at this time, the high level signal Von charges the capacitor C at the first node A via the third switch $M_3$ and the first switch $M_1$. Since the first clock signal CLK is at low level, the ninth switch $M_9$ is turned off, and the output end Output outputs low level.

Meanwhile, since the signal inputted through the second input $G_2$ is at low level, the second switch $M_2$ is turned off. The eighth switch $M_8$ is turned off by the seventh switch that is turned off. Since the second clock signal CLKB is at high level, the tenth switch $M_{10}$ is turned on. Since the control signal CN is at high level, the eleventh switch $M_{11}$ is turned on. The second clock signal CLKB is connected to the low level signal Vss via the tenth switch $M_{10}$ and the eleventh switch $M_{11}$, such that the gates of the twelfth switch $M_{12}$ and the thirteenth switch $M_{13}$ receive the low level signal Vss, then the twelfth switch $M_{12}$ and the thirteenth switch $M_{13}$ are turned off. Since the fifteenth switch $M_{15}$ is turned on, the gate of the fourteenth switch $M_{14}$ receives the signal inputted through the second input $G_2$, such that the fourteenth switch $M_{14}$ is turned off.

It should be noted that, since the seventh $M_7$, the eighth $M_8$, the twelfth $M_{12}$ and the thirteenth $M_{13}$ switches are turned off, the high level signal Von charges the capacitor C at the first node A via the third switch $M_3$ and the first switch $M_1$, and the first clock signal CLK, which is at low level, turns off the ninth switch $M_9$, so as to ensure that no discharging occurs during the charging of the circuit of the capacitor C, and to ensure the stability of the output end Output.

S102: At the second stage, the signal inputted through the first input $G_1$ turns off the first switch $M_1$, the first forward DC signal $VDCF_1$ turns on the third switch $M_3$. The second $M_2$, the fourth $M_4$, the fifth $M_5$, the seventh $M_7$, the eighth $M_8$, the tenth $M_{10}$, the twelfth $M_{12}$, the thirteenth $M_{13}$, and the fourteenth switches $M_{14}$ are turned off, the sixth $M_6$, the eleventh $M_{11}$, and the fifteenth switches $M_{15}$ are turned on. The first clock signal CLK, which is at high level, turns on the ninth switch $M_9$ and outputs from the output end Output.

For example, see FIGS. 5 and 6, at the second stage 2, the first forward DC signal $VDCF_1$ and the second forward DC signal $VDCF_2$ are at high level, the first reverse DC signal $VDCR_1$ and the second reverse DC signal $VDCR_2$ are at low level, the first clock signal CLK is at high level, the second clock signal CLKB is at low level, the signal inputted through the first input $G_1$ is at low level, the signal inputted through the second input $G_2$ is at low level, the control signal CN is at high level.

Since the first forward DC signal $VDCF_1$ and the second forward DC signal $VDCF_2$ are high level signals, the first forward DC signal $VDCF_1$ turns on the third switch $M_3$, and the second forward DC signal $VDCF_2$ turns on the sixth switch M6 and the fifteenth switch M15. Since the first reverse DC signal $VDCR_1$ and the second reverse DC signal $VDCR_2$ are low level signals, the first reverse DC signal $VDCR_1$ turns off the fifth switch $M_5$, the second reverse DC signal $VDCR_2$ turns off the seventh $M_7$ and the fourth $M_4$ switches. Since the signal inputted through the first input $G_1$ is at low level, the first switch $M_1$ is turned off, and at this time, the high level signal Von cannot pass through the first switch M1 which is already turned off. But, since the high level signal Von has already charged the capacitor C at the first node A via the third switch $M_3$ and the first switch $M_1$, the gate of the ninth switch $M_9$ connected with the capacitor C is maintained at high level, such that the ninth switch $M_9$ is turned on, and the first clock signal CLK is passed through the ninth switch $M_9$ and is outputted from the output end Output.

Meanwhile, since the signal inputted through the second input $G_2$ is at low level, the second switch $M_2$ is turned off. The eighth switch $M_8$ is turned off because the seventh switch $M_7$ is turned off. Since the second clock signal CLKB is at low level, the tenth switch $M_{10}$ is turned off. Since the control signal CN is at high level, the eleventh switch $M_{11}$ is turned on. Since the gates of the twelfth switch $M_{12}$ and the thirteenth switch $M_{13}$ both are connected with the drain of the tenth switch $M_{10}$, the twelfth switch $M_{12}$ and the thirteenth switch $M_{13}$ are turned off. Since the fifteenth switch $M_{15}$ is turned on, the gate of the fourteenth switch $M_{14}$ receives the signal inputted through the second input $G_2$, such that the fourteenth switch $M_{14}$ is turned off.

It should be noted that, in the second stage, the current in the shift register unit is derived from the first clock signal CLK and outputted at the output end Output after passing through the ninth switch $M_9$ It is to be understood that, while transferring signals, the voltage at the first node A of the capacitor C could be magnified due to the bootstrapping effect of the ninth switch $M_9$, so that the signal outputted from the output end Output is more stable and better in quality. Wherein, the bootstrapping effect is such an effect that the discharge voltage of the capacitor C is added to a supply power through components such as capacitor, diode and the like, so as to raise the voltage at the gate.

S103: At the third stage, the second forward DC signal $VDCF_2$ turns on the sixth $M_6$ and the fifteenth switch $M_{15}$; the high level signal inputted through the second input $G_2$ turns on the second $M_2$ and the fourteenth $M_{14}$ switches. The first $M_1$, the fourth $M_4$, the fifth $M_5$, the seventh $M_7$, the eighth $M_8$, the twelfth $M_{12}$, the thirteenth $M_{13}$, and the ninth switches $M_9$ are turned off; the third $M_3$, the tenth $M_{10}$, and the eleventh switches $M_{11}$ are turned on. The capacitor C is discharged via the second $M_2$ and the fourteenth switches $M_{14}$ which are turned on. The output end Output outputs low level.

For example, see FIGS. 5 and 6, at the third stage 3, the first forward DC signal $VDCF_1$ and the second forward DC signal $VDCF_2$ are at high level, the first reverse DC signal $VDCR_1$ and the second reverse DC signal $VDCR_2$ are at low level, the first clock signal CLK is at low level, the second clock signal CLKB is at high level, the signal inputted through the first input $G_1$ is at low level, the signal inputted through the second input $G_2$ is at high level, the control signal CN is at high level.

Since the first forward DC signal $VDCF_1$ and the second forward DC signal $VDCF_2$ are high level signals, the first forward DC signal $VDCF_1$ turns on the third switch $M_3$, and the second forward DC signal $VDCF_2$ turns on the sixth switch $M_6$ and the fifteenth switch $M_{15}$. Since the first reverse DC signal $VDCR_1$ and the second reverse DC signal $VDCR_2$ are low level signals, the first reverse DC signal $VDCR_1$ turns off the fifth switch $M_5$, the second reverse DC signal $VDCR_2$ turns off the seventh $M_7$ and the fourth $M_4$ switches. Since the signal inputted through the second input $G_2$ is at high level, the second switch $M_2$ is turned on by the signal inputted through the second input $G_2$. The fifteenth switch $M_{15}$ is turned on, then the fourteenth switch $M_{14}$ is turned on, and the gate of the fourteenth switch $M_{14}$ is connected with the signal inputted through the second input $G_2$, such that the fourteenth switch $M_{14}$ is turned on. The drains of the second switch $M_2$ and the fourteenth switch $M_{14}$ receive low level signal Vss, such that the capacitor C is discharged via the second switch $M_2$ and the fourteenth switch $M_{14}$. Therefore, the gate of the ninth switch $M_9$ connected with the capacitor C is switched into low level, such that the ninth switch $M_9$ is turned off, and the output end Output outputs low level.

Meanwhile, since the signal inputted through the first input $G_1$ is at low level, the first switch $M_1$ is turned off. The eighth switch $M_8$ is turned off because the seventh switch $M_7$ is turned off. Since the second clock signal CLKB is at high level, the tenth switch $M_{10}$ is turned on. Since the control signal CN is at high level, the eleventh switch $M_{11}$ is turned on. The second clock signal CLKB is connected to the low level signal Vss via the tenth switch $M_{10}$ and the eleventh switch $M_{11}$, such that the gates of the twelfth switch $M_{12}$ and the thirteenth switch $M_{13}$ receive the low level signal Vss, then the twelfth switch $M_{12}$ and the thirteenth switch $M_{13}$ are turned off S104: At the fourth stage, the second clock signal CLKB, which is at low level, turns off the tenth switch $M_{10}$, the control signal CN turns off the eleventh switch $M_{11}$. The first $M_1$, the second $M_2$, the fourth $M_4$, the fifth $M_5$, the seventh $M_7$, the eighth $M_8$, the ninth $M_9$, the twelfth $M_{12}$, the thirteenth $M_{13}$, and the fourteenth switches $M_{14}$ are turned off; the third $M_3$, the sixth $M_6$, and the fifteenth switches $M_{15}$ are turned on. The output end Output outputs low level.

For example, see FIGS. 5 and 6, at the fourth stage 4, the first forward DC signal $VDCF_1$ and the second forward DC signal $VDCF_2$ are high level signals, the first reverse DC signal $VDCR_1$ and the second reverse DC signal $VDCR_2$ are low level signals, the first clock signal CLK is at high level, the second clock signal CLKB is at low level, the signal inputted through the first input $G_1$ is at low level, the signal inputted through the second input $G_2$ is at low level, the control signal CN is at high level.

Since the first forward DC signal $VDCF_1$ and the second forward DC signal $VDCF_2$ are high level signals, the first forward DC signal $VDCF_1$ turns on the third switch $M_3$, and the second forward DC signal $VDCF_2$ turns on the sixth switch M6 and the fifteenth switch $M_{15}$. Since the first reverse DC signal $VDCR_1$ and the second reverse DC signal $VDCR_2$ are low level signals, the first reverse DC signal $VDCR_1$ turns off the fifth switch $M_5$, the second reverse DC signal $VDCR_2$ turns off the seventh $M_7$ and the fourth $M_4$ switches. Since the second clock signal CLKB is at low level, the tenth switch $M_{10}$ is turned off; since the control signal CN is at low level, the eleventh switch $M_{11}$ is turned off; since the gates of the twelfth switch $M_{12}$ and the thirteenth switch $M_{13}$ are connected with the drain of the tenth switch $M_{10}$, the twelfth switch $M_{12}$ and the thirteenth switch $M_{13}$ both are turned off.

Meanwhile, since the signal inputted through the first input $G_1$ is at low level, the first switch $M_1$ is turned off; since the signal inputted through the second input $G_2$ is at low level, the turn-off of the seventh switch $M_7$ renders the eighth switch $M_8$ to be turned off, and the turn-off of the first switch $M_1$ renders the ninth switch $M_9$ to be turned off. Since the fifteenth switch $M_{15}$ is turned on, the gate of the fourteenth switch $M_{14}$ receives the signal inputted through the second input $G_2$, such that the fourteenth switch $M_{14}$ is turned off. The output end Output outputs low level.

S105: At the fifth stage, the second clock signal CLKB, which is at high level, turns on the tenth switch $M_{10}$; the control signal CN turns off the eleventh switch $M_{11}$. The first $M_1$, the second $M_2$, the fourth $M_4$, the fifth $M_5$, the seventh $M_7$, the eighth $M_8$, the ninth $M_9$, the fourteenth switches $M_{14}$ are turned off, the third $M_3$, the sixth $M_6$, the twelfth $M_{12}$, the thirteenth $M_{13}$, and the fifteenth switches $M_{15}$ are turned on. The noise at the first node A and the second node B of the capacitor C is released through the twelfth and the thirteenth switches which are turned on, so as to ensure that the output end Output of the shift register is stably maintained at low level.

For example, see FIGS. 5 and 6, at the fifth stage 5, the first forward DC signal VDCF1 and the second forward DC signal $VDCF_2$ are high level signals, the first reverse DC signal $VDCR_1$ and the second reverse DC signal $VDCR_2$ are low level signals, the first clock signal CLK is at low level, the second clock signal CLKB is at high level, the signal inputted through the first input $G_1$ is at low level, the signal inputted through the second input $G_2$ is at low level, the control signal CN is at low level.

Since the first forward DC signal $VDCF_1$ and the second forward DC signal $VDCF_2$ are high level signals, the first forward DC signal $VDCF_1$ turns on the third switch $M_3$, and the second forward DC signal $VDCF_2$ turns on the sixth switch $M_6$ and the fifteenth switch $M_{15}$; since the first reverse DC signal $VDCR_1$ and the second reverse DC signal $VDCR_2$ are low level signals, the first reverse DC signal $VDCR_1$ turns off the fifth switch $M_5$, the second reverse DC signal $VDCR_2$ turns off the seventh $M_7$ and the fourth $M_4$ switches. Since the second clock signal CLKB is at high level, the tenth switch $M_{10}$ is turned on; since the control signal CN is at low level, the eleventh switch $M_{11}$ is turned off; since the gates of the twelfth switch $M_{12}$ and the thirteenth switch $M_{13}$ are connected with the drain of the tenth switch $M_{10}$, the twelfth switch $M_{12}$ and the thirteenth switch $M_{13}$ are turned on. Since the source of the twelfth switch $M_{12}$ and the drain of the thirteenth switch $M_{13}$ both receive the low level signal Vss, the noise at the first node A and the second node B of the capacitor C is released via the twelfth switch $M_{12}$ and the thirteenth switch $M_{13}$ respectively, so as to ensure that the output end Output is stably maintained at low level.

Meanwhile, since the signal inputted through the first input $G_1$ is at low level, the first switch $M_1$ is turned off; since the signal inputted through the second input $G_2$ is at low level, the second switch $M_2$ is turned off. The eighth switch $M_8$ is turned off because the seventh switch $M_7$ is turned off. The ninth switch $M_9$ is turned off because the first switch $M_1$ is turned off. Since the fifteenth switch $M_{15}$ is turned on, the gate of the fourteenth switch $M_{14}$ receives the signal inputted through the second input $G_2$, such that the fourteenth switch $M_{14}$ is turned off.

It is to be appreciated that, all the other signals, whether affect the circuit or not, are called "noise", except the target signal which is needed in the circuit. The target signal of the shift register units provided in the embodiment of the present invention is the output signal outputted from the output end Output. However, the coupling signals generated among the numerous switches would affect the output of the shift register unit, even an output error would occur. In order to reduce the noise, the noise at the first node A and the second node B of the capacitor C need to be released. The detailed method is described in the above embodiment, and will be omitted herein.

Furthermore, each one of the first switch $M_1$, the second switch $M_2$, the third switch $M_3$, the fourth switch $M_4$, the fifth switch $M_5$, the sixth switch $M_6$, the seventh switch $M_7$, the eighth switch $M_8$, the ninth switch $M_9$, the tenth switch $M_{10}$, the eleventh switch $M_{11}$, the twelfth switch $M_{12}$, the thirteenth switch $M_{13}$, the fourteenth switch $M_{14}$, and the fifteenth switch $M_{15}$ is a N-type thin-film transistor.

It is noted that, in the scanning method for shift register provided in the embodiment of the present invention, before the first stage restarts, that is to say, before the first input $G_1$ restarts to receive signals, the shift register unit alternatively repeats the fourth and the fifth stages to reduce noise repeatedly. For example, the shift register unit receives the signal inputted through the first input $G_1$, and executes the first to the fifth stages successively. After that, if no signal is received by the first input $G_1$, the shift register unit repeatedly executes the fourth and the fifth stages, until a signal is received by the first input $G_1$. Then, the shift register unit goes back to execute the first stage, and then the second to the fifth stages successively.

A scanning method for shift register is provided in embodiments of the invention for using in the shift register as described in the above embodiments. With the configuration of the shift register unit, the turn-off/turn-on state of each switch is controlled by the voltage across the gate and the source of the switch, so as to turn off or turn on the switch in different stages. Such that, bidirectional scanning of the shift register can be achieved while the number of the switches used in the shift register could be reduced, and the spaces are saved. Furthermore, the problem of large coupled noise voltage is solved, and the performance of the shift register is improved.

A second scanning method for the shift registers as described in the above embodiments is provided according to a second embodiment of the present invention, wherein the first forward DC signal and the second forward DC signal are low level signals, the first reverse DC signal and the second reverse DC signal are high level signals. The method comprises the following steps of:

at a first stage, the second reverse DC signal turns on the fourth switch, the signal inputted through the second input turns on the second switch, and the ninth switch is turned on; the capacitor is charged at the first node by the high level signal via the fourth and the second switches; the first, the third, the sixth, the eighth, the twelfth, the thirteenth, the fourteenth, and the fifteenth switches are turned off; the fifth, the seventh, the tenth, and the eleventh switches are turned on; the first clock signal, which is at low level, maintains the ninth switch at turn-off state; the output end outputs low level;

at a second stage, the signal inputted through the second input turns off the second switch, the second reverse DC signal turns on the fourth switch, and the voltage at the first node of the capacitor maintains the ninth switch at turn-on state; the first, the third, the sixth, the eighth, the tenth, the twelfth, the thirteenth, the fourteenth, and the fifteenth switches are turned off; the fifth, the seventh, and the eleventh switches are turned on; the first clock signal, which is at high level, is outputted from the output end via the ninth switch;

at a third stage, the second reverse DC signal turns on the fourth and the seventh switches; the high level signal inputted through the first input turns on the first and the eighth switches; the second, the third, the sixth, the twelfth, the thirteenth, the fourteenth, the fifteenth, and the ninth switches are turned off; the fifth, the tenth, and the eleventh switches are turned on; the capacitor is discharged via the first and the eighth switches; the output end outputs low level;

at a fourth stage, the second clock signal, which is at low level, turns off the tenth switch; the control signal turns off the eleventh switch; the first, the second, the third, the sixth, the eighth, the ninth, the twelfth, the thirteenth, the fourteenth, and the fifteenth switches are turned off; the fourth, the fifth, and the seventh switches are turned on; the output end outputs low level;

at a fifth stage, the second clock signal, which is at high level, turns on the tenth switch; the control signal turns off the eleventh switch; the first, the second, the third, the sixth, the eighth, the ninth, the fourteenth and the fifteenth switches are turned off; the fourth, the fifth, the seventh, the twelfth, the thirteenth switches are turned on; the noises at the first and the second nodes of the capacitor are released via the twelfth and the thirteenth switches which are turned on, so as to ensure that the output end of the shift register is stably maintained at low level.

Figure 7:
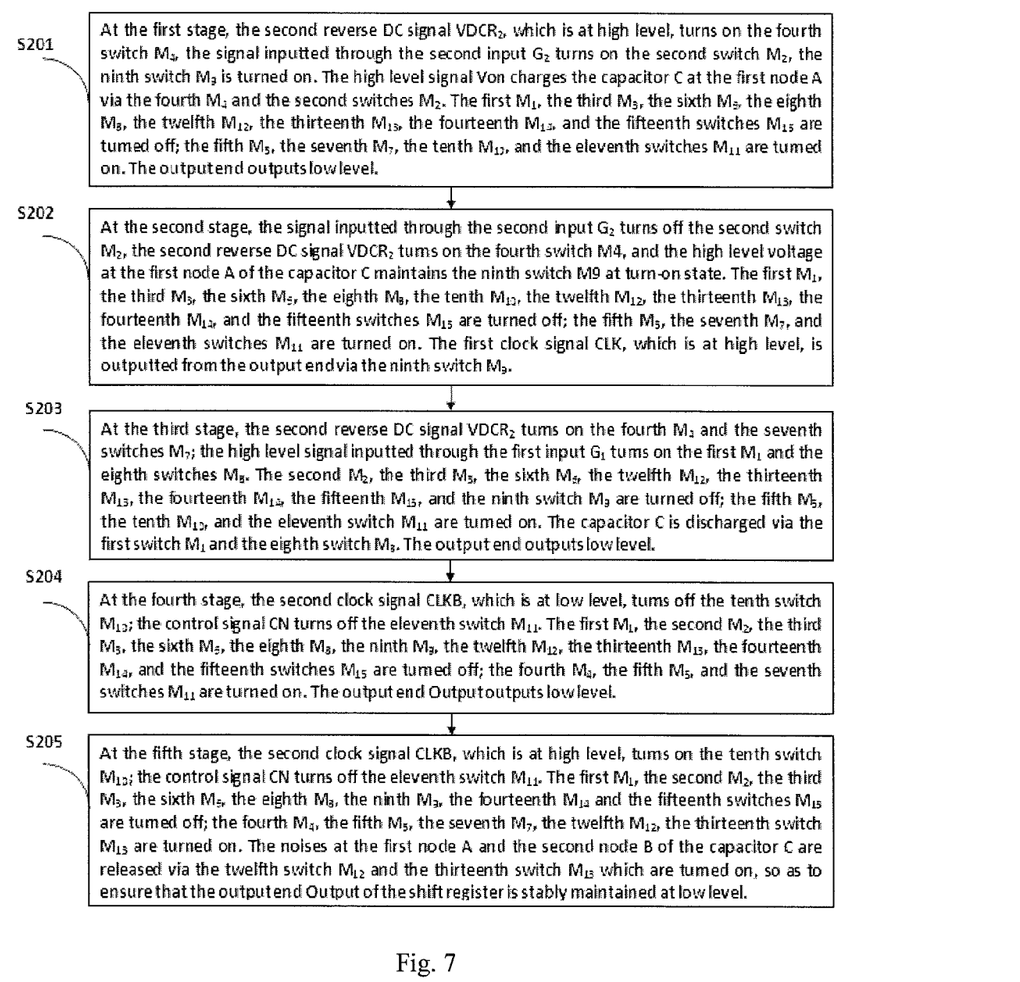
FIG. 7 is a flowchart of the second scanning method of the shift register unit in the shift register of FIG. 2.
Figure 8:
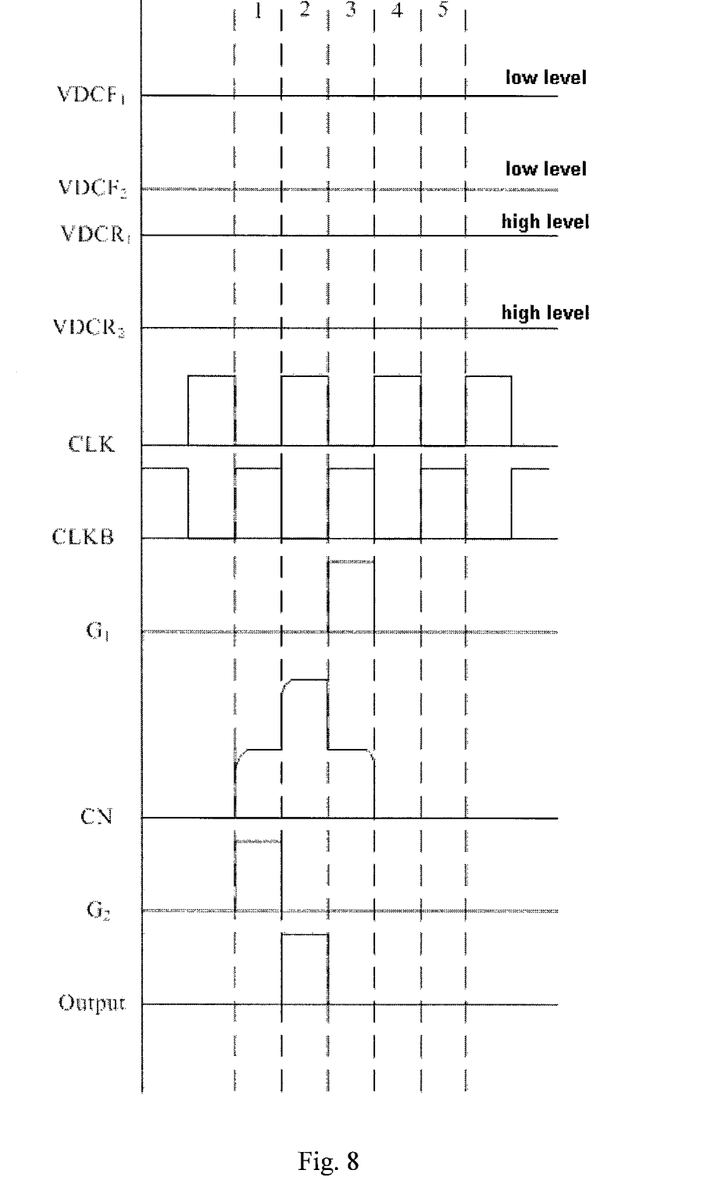
FIG. 8 is a sequence chart of the shift register unit in the shift register for performing the flowchart of FIG. 5.

Specifically, as shown in FIG. 7, the scanning method of the shift register unit of FIG. 1 in the shift register of FIG. 2 comprises the following steps in accord with the sequence chart shown in FIG. 8:

S201: At the first stage, the second reverse DC signal $VDCR_2$, which is at high level, turns on the fourth switch $M_4$, the signal inputted through the second input $G_2$ turns on the second switch $M_2$, the ninth switch $M_9$ is turned on. The high level signal Von charges the capacitor C at the first node A via the fourth $M_4$ and the second switches $M_2$. The first $M_1$, the third $M_3$, the sixth $M_6$, the eighth $M_8$, the twelfth $M_{12}$, the thirteenth $M_{13}$, the fourteenth $M_{14}$, and the fifteenth switches $M_{15}$ are turned off; the fifth $M_5$, the seventh $M_7$, the tenth $M_{10}$, and the eleventh switches $M_{11}$ are turned on. The output end outputs low level.

For example, see FIGS. 7 and 8, at the first stage 1, the first forward DC signal $VDCF_1$ and the second forward DC signal $VDCF_2$ are low level signals, the first reverse DC signal $VDCR_1$ and the second reverse DC signal $VDCR_2$ are high level signals, the first clock signal CLK is at low level, the second clock signal CLKB is at high level, the signal inputted through the first input $G_1$ is at low level, the signal inputted through the second input $G_2$ is at high level, the control signal CN is at high level.

Since the first forward DC signal $VDCF_1$ and the second forward DC signal $VDCF_2$ are low level signals, the first forward DC signal $VDCF_1$ turns off the third switch $M_3$, and the second forward DC signal $VDCF_2$ turns off the sixth $M_6$ and the fifteenth $M_{15}$ switches; since the first reverse DC signal $VDCR_1$ and the second reverse DC signal $VDCR_2$ are high level signals, the first reverse DC signal $VDCR_1$ turns on the fifth switch $M_5$, the second reverse DC signal $VDCR_2$ turns on the seventh $M_7$ and the fourth $M_4$ switches. Since the signal inputted through the second input $G_2$ is at high level, the signal inputted through the second input $G_2$ turns on the second switch $M_2$, and at this time, the high level signal Von charges the capacitor C at the first node A via the fourth switch $M_4$ and the second switch $M_2$ which are turned on. Because the fourth switch $M_4$ and the second switch $M_2$ are turned on, the gate of the ninth switch $M_9$ receives the high level signal Von, and the ninth switch $M_9$ is turned on. Since the first clock signal CLK is at low level, the first clock signal CLK maintains the ninth switch $M_9$ at turn-off state, and the output end Output outputs low level.

Meanwhile, since the signal inputted through the first input $G_1$ is at low level, the first switch $M_1$ is turned off. Since the seventh switch $M_7$ is turned on, the gate of the eighth switch $M_8$ receives the signal inputted through the first input $G_1$, and the eighth switch $M_8$ is turned off. Since the second clock signal CLKB is at high level, the tenth switch $M_{10}$ is turned on. Since the control signal CN is at high level, the eleventh switch $M_{11}$ is turned on. the second clock signal CLKB is connected to the low level signal Vss via the tenth switch $M_{10}$ and the eleventh switch $M_{11}$, such that the gates of the twelfth switch $M_{12}$ and the thirteenth switch $M_{13}$ both receive the low level signal Vss, and the twelfth switch $M_{12}$ and the thirteenth switch $M_{13}$ are turned off. The fifteenth switch $M_{15}$, which is turned on, controls the fourteenth switch $M_{14}$ into turn-off state. It should be noted that, since twelfth $M_{12}$, the thirteenth $M_{13}$, the fourteenth $M_{14}$, and the fifteenth switch $M_{15}$ are turned off, the high level signal Von charges the capacitor C at the first node A via the fourth switch $M_4$ and the second switch $M_2$, and the first clock signal CLK, which is at low level, maintains the ninth switch $M_9$ at turn-off state, so as to ensure that no discharging occurs during the charging of the circuit of the capacitor C, and to ensure the stability of the output end Output.

S202: At the second stage, the signal inputted through the second input $G_2$ turns off the second switch $M_2$, the second reverse DC signal $VDCR_2$ turns on the fourth switch M4, and the high level voltage at the first node A of the capacitor C maintains the ninth switch M9 at turn-on state. The first $M_1$, the third $M_3$, the sixth $M_6$, the eighth $M_8$, the tenth $M_{10}$, the twelfth $M_{12}$, the thirteenth $M_{13}$, the fourteenth $M_{14}$, and the fifteenth switches $M_{15}$ are turned off; the fifth $M_5$, the seventh $M_7$, and the eleventh switches $M_{11}$ are turned on. The first clock signal CLK, which is at high level, is outputted from the output end via the ninth switch $M_9$.

For example, see FIGS. 7 and 8, at the second stage 2, the first forward DC signal $VDCF_1$ and the second forward DC signal $VDCF_2$ are low level signals, the first reverse DC signal $VDCR_1$ and the second reverse DC signal $VDCR_2$ are high level signals, the first clock signal CLK is at high level, the second clock signal CLKB is at low level, the signal inputted through the first input $G_1$ is at low level, the signal inputted through the second input $G_2$ is at low level, the control signal CN is at high level.

Since the first forward DC signal $VDCF_1$ and the second forward DC signal $VDCF_2$ are low level signals, the first forward DC signal $VDCF_1$ turns off the third switch $M_3$, and the second forward DC signal $VDCF_2$ turns off the sixth $M_6$ and the fifteenth $M_{15}$ switches; since the first reverse DC signal $VDCR_1$ and the second reverse DC signal $VDCR_2$ are high level signals, the first reverse DC signal $VDCR_1$ turns on the fifth switch $M_5$, the second reverse DC signal $VDCR_2$ turns on the seventh $M_7$ and the fourth $M_4$ switches. Since the signal inputted through the second input $G_2$ is at low level, the second switch $M_2$ is turned off, and at this time, the high level signal Von cannot pass through the second switch $M_2$ which is already turned off. But, since the high level signal Von has already charged the capacitor C at the first node A via the fourth switch $M_4$ and the second switch $M_2$, the ninth switch $M_9$ connected with the first node A is maintained at high level, such that the ninth switch $M_9$ is turned on, and the first clock signal CLK is passed through the ninth switch $M_9$ and is outputted from the output end Output.

Meanwhile, since the signal inputted through the first input $G_1$ is at low level, the first switch $M_1$ is turned off. Since the seventh switch $M_7$ is turned on, the gate of the eighth switch $M_8$ receives the signal inputted through the first input $G_1$, and the eighth switch $M_8$ is turned off. Since the second clock signal CLKB is at low level, the tenth switch $M_{10}$ is turned off. Since the control signal CN at is at high level, the eleventh switch $M_{11}$ is turned on. Since the gates of the twelfth switch $M_{12}$ and the thirteenth switch $M_{13}$ both are connected with the drain of the tenth switch $M_{10}$, the twelfth switch $M_{12}$ and the thirteenth switch $M_{13}$ are turned off. The fifteenth switch $M_{15}$, which is turned off, controls the fourteenth switch $M_{14}$ into turn-off state.

It should be noted that, in the second stage, the current in the shift register unit is derived from the first clock signal CLK and outputted from the output end Output after passing through the ninth switch $M_9$.

It is to be understood that, while transferring signals, the voltage at the first node A of the capacitor C could be magnified due to the bootstrapping effect of the ninth switch $M_9$, so that the signal outputted from the output end Output is more stable and better in quality. Wherein, the bootstrapping effect is such an effect that the discharge voltage of the capacitor C is added to a supply power through components such as capacitor, diode and the like, so as to raise the voltage at the gate.

S203: At the third stage, the second reverse DC signal $VDCR_2$ turns on the fourth $M_4$ and the seventh switches $M_7$; the high level signal inputted through the first input $G_1$ turns on the first $M_1$ and the eighth switches $M_8$. The second $M_2$, the third $M_3$, the sixth $M_6$, the twelfth $M_{12}$, the thirteenth $M_{13}$, the fourteenth $M_{14}$, the fifteenth $M_{15}$, and the ninth switch $M_9$ are turned off; the fifth $M_5$, the tenth $M_{10}$, and the eleventh switch $M_{11}$ are turned on. The capacitor C is discharged via the first switch $M_1$ and the eighth switch $M_8$. The output end outputs low level.

For example, see FIGS. 7 and 8, at the third stage 3, the first forward DC signal $VDCF_1$ and the second forward DC signal $VDCF_2$ are low level signals, the first reverse DC signal $VDCR_1$ and the second reverse DC signal $VDCR_2$ are high level signals, the first clock signal CLK is at low level, the second clock signal CLKB is at high level, the signal inputted through the first input $G_1$ is at high level, the signal inputted through the second input $G_2$ is at low level, the control signal CN is at high level.

Since the first forward DC signal $VDCF_1$ and the second forward DC signal $VDCF_2$ are low level signals, the first forward DC signal $VDCF_1$ turns off the third switch $M_3$, and the second forward DC signal $VDCF_2$ turns off the sixth switch $M_6$ and the fifteenth switch $M_{15}$. Since the first reverse DC signal $VDCR_1$ and the second reverse DC signal $VDCR_2$ are high level signals, the first reverse DC signal $VDCR_1$ turns on the fifth switch $M_5$, the second reverse DC signal $VDCR_2$ turns on the seventh $M_7$ and the fourth $M_4$ switches. Since the signal inputted through the first input $G_1$ is at high level, the first switch $M_1$ is turned on by the signal inputted through the first input $G_1$. Since the seventh switch $M_7$ is turned on, the gate of the eighth switch $M_8$ receives the signal inputted through the first input $G_1$. The sources of the first switch $M_1$ and the eighth switch $M_8$ receive low level signal Vss, such that the capacitor C is discharged via the first switch $M_1$ and the eighth switch $M_8$. Therefore, the gate of the ninth switch $M_9$ connected with the capacitor C is switched into low level, such that the ninth switch $M_9$ is turned off, and the output end Output outputs low level.

Meanwhile, since the signal inputted through the second input $G_2$ is at low level, the second switch $M_1$ is turned off. Since the second clock signal CLKB is at high level, the tenth switch $M_{10}$ is turned on. Since the control signal CN is at high level, the eleventh switch $M_{11}$ is turned on. The second clock signal CLKB is connected to the low level signal Vss via the tenth switch $M_{10}$ and the eleventh switch $M_{11}$, such that the gates of the twelfth switch $M_{12}$ and the thirteenth switch $M_{13}$ receive the low level signal Vss, then the twelfth switch $M_{12}$ and the thirteenth switch $M_{13}$ are turned off. The fifteenth switch $M_{15}$, which is turned off, control the fourteenth switch M14 into turn-off state.

S204: At the fourth stage, the second clock signal CLKB, which is at low level, turns off the tenth switch $M_{10}$; the control signal CN turns off the eleventh switch $M_{11}$. The first $M_1$, the second $M_2$, the third $M_3$, the sixth $M_6$, the eighth $M_8$, the ninth $M_9$, the twelfth $M_{12}$, the thirteenth $M_{13}$, the fourteenth $M_{14}$, and the fifteenth switches $M_{15}$ are turned off; the fourth $M_4$, the fifth $M_5$, and the seventh switches $M_{11}$ are turned on. The output end Output outputs low level.

For example, see FIGS. 7 and 8, at the fourth stage 4, the first forward DC signal $VDCF_1$ and the second forward DC signal $VDCF_2$ are low level signals, the first reverse DC signal $VDCR_1$ and the second reverse DC signal $VDCR_2$ are high level signals, the first clock signal CLK is at high level, the second clock signal CLKB is at low level, the signal inputted through the first input $G_1$ is at low level, the signal inputted through the second input $G_2$ is at low level, the control signal CN is at low level.

Since the first forward DC signal $VDCF_1$ and the second forward DC signal $VDCF_2$ are low level signals, the first forward DC signal $VDCF_1$ turns off the third switch $M_3$, and the second forward DC signal $VDCF_2$ turns off the sixth $M_6$ and the fifteenth $M_{15}$ switches; since the first reverse DC signal $VDCR_1$ and the second reverse DC signal $VDCR_2$ are high level signals, the first reverse DC signal $VDCR_1$ turns on the fifth switch $M_5$, the second reverse DC signal $VDCR_2$ turns on the seventh $M_7$ and the fourth $M_4$ switches. Since the second clock signal CLKB is at low level, the tenth switch $M_{10}$ is turned off. Since the control signal CN is at low level, the eleventh switch $M_{11}$ is turned off. Since the gates of the twelfth switch $M_{12}$ and the thirteenth switch $M_{13}$ are connected with the drain of the tenth switch $M_{10}$, the twelfth switch $M_{12}$ and the thirteenth switch $M_{13}$ are turned off.

Meanwhile, since the signal inputted through the first input $G_1$ is at low level, the first switch $M_1$ is turned off; since the signal inputted through the second input $G_2$ is at low level, the second switch $M_2$ is turned off. Since the seventh switch $M_7$ is turned off, the gate of the eighth switch $M_8$ receives the signal inputted through the first input $G_1$, and the eighth switch $M_8$ is turned off. The first switch $M_1$, which is turned off, causes the ninth switch $M_9$ to switch into turn-off state, and the fifteenth switch $M_{15}$, which is turned off, controls the fourteenth switch $M_{14}$ into turn-off state. The output end Output outputs low level.

S205: At the fifth stage, the second clock signal CLKB, which is at high level, turns on the tenth switch $M_{10}$; the control signal CN turns off the eleventh switch $M_{11}$. The first $M_1$, the second $M_2$, the third $M_3$, the sixth $M_6$, the eighth $M_8$, the ninth $M_9$, the fourteenth $M_{14}$ and the fifteenth switches $M_{15}$ are turned off; the fourth $M_4$, the fifth $M_5$, the seventh $M_7$, the twelfth $M_{12}$, the thirteenth switch $M_{13}$ are turned on. The noises at the first node A and the second node B of the capacitor C are released via the twelfth switch $M_{12}$ and the thirteenth switch $M_{13}$ which are turned on, so as to ensure that the output end Output of the shift register is stably maintained at low level.

For example, see FIGS. 7 and 8, at the fifth stage 5, the first forward DC signal $VDCF_1$ and the second forward DC signal $VDCF_2$ are low level signals, the first reverse DC signal $VDCR_1$ and the second reverse DC signal $VDCR_2$ are high level signals, the first clock signal CLK is at low level, the second clock signal CLKB is at high level, the signal inputted through the first input $G_1$ is at low level, the signal inputted through the second input $G_2$ is at low level, the control signal CN is at low level.

Since the first forward DC signal $VDCF_1$ and the second forward DC signal $VDCF_2$ are low level signals, the first forward DC signal $VDCF_1$ turns off the third switch $M_3$, and the second forward DC signal $VDCF_2$ turns off the sixth switch $M_6$ and the fifteenth switch $M_{15}$. Since the first reverse DC signal $VDCR_1$ and the second reverse DC signal $VDCR_2$ are high level signals, the first reverse DC signal $VDCR_1$ turns on the fifth switch $M_5$, the second reverse DC signal $VDCR_2$ turns on the seventh $M_7$ and the fourth $M_4$ switches. Since the second clock signal CLKB is at high level, the tenth switch $M_{10}$ is turned on. Since the control signal CN is at low level, the eleventh switch $M_{11}$ is turned off. Since the gates of the twelfth switch $M_{12}$ and the thirteenth switch $M_{13}$ are connected with the drain of the tenth switch $M_{10}$, the twelfth switch $M_{12}$ and the thirteenth switch $M_{13}$ are turned on. Since the source of twelfth switch $M_{12}$ and the drain of the thirteenth switch $M_{13}$ receive low level signal Vss, the noises at the first node A and the second node B of the capacitor C are released via the twelfth switch $M_{12}$ and the thirteenth switch $M_{13}$, so as to ensure that the output end Output of the shift register is stably maintained at low level.

Meanwhile, since the signal inputted through the first input $G_1$ is at low level, the first switch $M_1$ is turned off; since the signal inputted through the second input $G_2$ is at low level, the second switch $M_2$ is turned off. Since the seventh switch $M_7$ is turned on, the gate of the eighth switch $M_8$ receives the signal inputted through the first input $G_1$, and the eighth switch $M_8$ is turned off. The first switch $M_1$, which is turned off, causes the ninth switch $M_9$ to switch into turn-off state, and the fifteenth switch $M_{15}$, which is turned off, controls the fourteenth switch $M_{14}$ into turn-off state.

It is to be appreciated that, all the other signals, whether affect the circuit or not, are called the "noise", except the target signal which is needed in the circuit. The target signal of the shift register units provided in the embodiment of the present invention is the output signal outputted from the output end Output. However, the coupling signals generated among the numerous switches would affect the output of the shift register unit, even an output error would occur. In order to reduce the noise, the noise at the first node A and the second node B of the capacitor C need to be released. The detailed method is described in the above embodiment, and will be omitted herein.

Furthermore, each one of the first switch $M_1$, the second switch $M_2$, the third switch $M_3$, the fourth switch $M_4$, the fifth switch $M_5$, the sixth switch $M_6$, the seventh switch $M_7$, the eighth switch $M_8$, the ninth switch $M_9$, the tenth switch $M_{10}$, the eleventh switch $M_{11}$, the twelfth switch $M_{12}$, the thirteenth switch $M_{13}$, the fourteenth switch $M_{14}$, and the fifteenth switch $M_{15}$ is a N-type thin-film transistor.

It is noted that, in the scanning method for shift register provided in the embodiment of the present invention, before the first stage restart, that is to say, before the first input $G_1$ restart to receive signals, the shift register unit alternatively repeats the fourth and the fifth stages to reduce noise repeatedly. The detailed scanning method is described in the above embodiment, and will be omitted herein.

As stated above, the difference between the first scanning method comprising the steps S101 to S105 and the second scanning method comprising the steps S201 to S205 are that: in the first method, the scanning is performed from top to bottom, wherein the signal inputted through the first input $G_1$ of the shift register unit is at high level at the first stage and at low level at other stages, the signal inputted through the second input $G_2$ is at high level at the third stage and at low level at other stages; while in the second method, the scanning is performed from bottom to top, wherein the signal inputted through the first input $G_1$ of the shift register unit is at high level at the third stage and at low level at other stages, the signal inputted through the second input $G_2$ is at high level at the first stage and at low level at other stages.

In the scanning methods provided in the above embodiments of the invention, the turn-off/turn-on state of each switch is controlled by the voltage across the gate and the source of the switch, so as to turn off or turn on the switch in different stages. Such that, bidirectional scanning can be achieved while the number of the switches used in the shift register could be reduced, and the spaces are saved. Furthermore, the problem of large coupled noise voltage is solved, and the performance of the shift register is improved.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A shift register unit, comprising:
a first switch, of which the gate electrode receives a signal inputted through a first input;
a second switch, of which the source electrode is connected with the drain electrode of the first switch, and the gate electrode receives a signal inputted through a second input;
a third switch, of which the drain electrode is connected with the source electrode of the first switch, the source electrode receives a high level signal, and the gate electrode receives a first forward DC signal;
a fourth switch, of which the source electrode is connected with the source electrode of the third switch, and the gate electrode receives a second reverse DC signal;
a fifth switch, of which the drain electrode is connected with the drain electrode of the third switch, the gate electrode receives a first reverse DC signal, and the source electrode receives a low level signal;
a sixth switch, of which the source electrode is connected with the source electrode of the fifth switch, the drain electrode is connected both with drains of the second switch and the fourth switch, and the gate electrode receives a second forward DC signal;
a seventh switch, of which the drain electrode receives the signal inputted through the first input, and the gate electrode receives the second reverse DC signal;
an eighth switch, of which the gate electrode is connected with the source electrode of the seventh switch, the source electrode is connected with the source electrode of the first switch, and the drain electrode is connected with an output end;
a ninth switch, of which the drain electrode is connected with the drain electrode of the eighth switch, the gate electrode is connected with the drain electrode of the first switch, and the source electrode receives a first clock signal;
a tenth switch, of which the source electrode and the gate electrode both receive a second clock signal;
an eleventh switch, of which the source electrode is connected with the drain electrode of the tenth switch, the gate electrode receives a control signal, and the drain electrode receives the low level signal;
a twelfth switch, of which the gate electrode is connected with the drain electrode of the tenth switch, the drain electrode is connected with the source electrode of the second switch, and the source electrode receives the low level signal;
a thirteenth switch, of which the gate electrode is connected with the drain electrode of the tenth switch, and the drain electrode receives the low level signal;
a fourteenth switch, of which the source electrode is connected with the source electrode of the thirteenth switch and the output end, and the drain electrode is connected with the drain electrode of the sixth switch;
a fifteenth switch, of which the source electrode is connected with the gate electrode of the fourteenth switch, the drain electrode receives the signal inputted through the second input, and the gate electrode receives the second forward DC signal; and
a capacitor positioned between a first node and a second node, wherein the first node is connected to the drain of the first switch, and the second node is connected to the output end.

2. The shift register unit according to claim 1, wherein each one of the first to the fifteenth switches is a N-type thin-film transistor.

3. The shift register unit according to claim 1, wherein one of the first clock signal and the second clock signal is at high level, and the other one is at low level.

4. A shift register, comprising (N+1) shift register units as defined in claim 1, wherein the output end of the Nth shift register unit is connected to the second input of the (N−1)th shift register unit, the output end of the Nth shift register unit is connected to the first input of the (N+1)th shift register unit, and N is a positive integer.

5. The shift register according to claim 4, wherein each one of the first to the fifteenth switches is a N-type thin-film transistor.

6. The shift register according to claim 4, wherein one of the first clock signal and the second clock signal is at high level, and the other one is at low level.

7. A display device, comprising:
a display area provided with a plurality of pixels for displaying images;
a gate drive circuit configured to send scanning signals to the display area; and
a data drive circuit configured to send data signals to the display area,
wherein the gate drive circuit comprises the shift register defined in claim 4.

8. A scanning method for the shift register defined in claim 4, wherein the first forward DC signal and the second forward DC signal are high level signals, the first reverse DC signal and the second reverse DC signal are low level signals, the method comprises:
at a first stage, the first forward DC signal turns on the third switch, the signal inputted through the first input turns on the first switch, the ninth switch is turned on, and the high level signal charges the capacitor via the third and the first switches; the second, the fourth, the fifth, the seventh, the eighth, the twelfth, the thirteenth, and fourteenth switches are turned off; the sixth, the tenth, the eleventh, and the fifteenth switches are turned on; the output end outputs low level;
at a second stage, the signal inputted through the first input turns off the first switch, the first forward DC signal turns on the third switch, and the voltage at the first node maintains the ninth switch at turn-on state; the second, the fourth, the fifth, the seventh, the eighth, the tenth, the twelfth, the thirteenth, and the fourteenth switches are turned off; the sixth, the eleventh, and the fifteenth switches are turned on; the first clock signal, which is at high level, is outputted from the output end via the ninth switch;

at a third stage, the second forward DC signal turns on the sixth and the fifteenth switches; the high level signal inputted through the second input turns on the second and the fourteenth switch; the first, the fourth, the fifth, the seventh, the eighth, the twelfth, the thirteenth, and the ninth switches are turned off; the third, the tenth, and the eleventh switches are turned on; the capacitor is discharged via the second and the fourteenth switches which are turned on; the output end outputs low level;

at a fourth stage, the second clock signal, which is at low level, turns off the tenth switch; the control signal turns off the eleventh switch; the first, the second, the fourth, the fifth, the seventh, the eighth, the ninth, the twelfth, the thirteenth, and the fourteenth switches are turned off; the third, the sixth, and the fifteenth switches are turned on; the second node of the capacitor is still maintained at low level, and the output end outputs low level; and at a fifth stage, the second clock signal, which is at high level, turns on the tenth switch; the control signal turns off the eleventh switch; the first, the second, the fourth, the fifth, the seventh, the eighth, the ninth, the fourteenth switches are turned off, the third, the sixth, the twelfth, the thirteenth, and the fifteenth switches are turned on; the noise at the first node and the second node of the capacitor is released via the twelfth and the thirteenth switch which are turned on, so as to ensure that the output end of the shift register is maintained stably at low level.

9. The scanning method according to claim 8, wherein each one of the first to fifteenth switches is a N-type thin-film transistor.

10. The scanning method according to claim 8, wherein one of the first clock signal and the second clock signal is at high level, and the other one is at low level.

11. A scanning method for the shift register defined in claim 4, wherein the first forward DC signal and the second forward DC signal are low level signals, the first reverse DC signal and the second reverse DC signal are high level signals, the method comprises the following steps:

at a first stage, the second reverse DC signal turns on the fourth switch, the signal inputted through the second input turns on the second switch, and the ninth switch is turned on; the high level signal charges the capacitor at the first node via the fourth and the second switch; the first, the third, the sixth, the eighth, the twelfth, the thirteenth, the fourteenth, and the fifteenth switches are turned off; the fifth, the seventh, the tenth, and the eleventh switches are turned on;

the first clock signal, which is at low signal, maintains the ninth switch at turn-off state; the output end outputs low level;

at a second stage, the signal inputted through the second input turns off the second switch, the second reverse DC signal turns on the fourth switch, and the voltage at the first node maintains the ninth switch at turn-on state; the first, the third, the sixth, the eighth, the tenth, the twelfth, the thirteenth, the fourteenth, and the fifteenth switches are turned off; the fifth, the seventh, and the eleventh switches are turned on; the first clock signal, which is at high level, is outputted from the output end via the ninth switch;

at a third stage, the second reverse DC signal turns on the fourth and the seventh switch; the high level signal inputted through the first input turns on the first and the eighth switches; the second, the third, the sixth, the twelfth, the thirteenth, the fourteenth, the fifteenth, and the ninth switches are turned off; the fifth, the tenth, and the eleventh switches are turned on; the capacitor is discharged via the first and the eighth switches; the output end outputs low level;

at a fourth stage, the second clock signal, which is at low level, turns off the tenth switch; the control signal turns off the eleventh switch; the first, the second, the third, the sixth, the eighth, the ninth, the twelfth, the thirteenth, the fourteenth, and the fifteenth switches are turned off; the fourth, the fifth, and the seventh switches are turned on; and the output end outputs low level;

at a fifth stage, the second clock signal, which is at high level, turns on the tenth switch; the control signal turns off the eleventh switch; the first, the second, the third, the sixth, the eighth, the ninth, the fourteenth and the fifteenth switches are turned off; the fourth, the fifth, the seventh, the twelfth, the thirteenth switches are turned on; the noises at the first and the second nodes of the capacitor are released via the twelfth and the thirteenth switches which are turned on, so as to ensure that the output end of the shift register is stably maintained at low level.

12. The scanning method according to claim 11, wherein each one of the first to the fifteenth switches is a N-type thin-film transistor.

13. The scanning method according to claim 11, wherein one of the first clock signal and the second clock signal is at high level, and the other one is at low level.

* * * * *